US009741902B2

(12) United States Patent
Maute et al.

(10) Patent No.: US 9,741,902 B2
(45) Date of Patent: Aug. 22, 2017

(54) OPTOELECTRONIC SEMICONDUCTOR CHIP

(71) Applicant: OSRAM Opto Semiconductors GmbH, Regensburg (DE)

(72) Inventors: Markus Maute, Alteglofsheim (DE); Karl Engl, Pentling (DE); Sebastian Taeger, Bad Abbach (DE); Robert Walter, Parsberg (DE); Johannes Stocker, München (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/156,802

(22) Filed: May 17, 2016

(65) Prior Publication Data
US 2016/0260870 A1 Sep. 8, 2016

Related U.S. Application Data

(63) Continuation of application No. 14/122,134, filed as application No. PCT/DE2012/100118 on Apr. 26, 2012, now Pat. No. 9,373,765.

(30) Foreign Application Priority Data

May 25, 2011 (DE) .................. 10 2011 102 376
Aug. 10, 2011 (DE) .................. 10 2011 109 042

(51) Int. Cl.
*H01L 29/49* (2006.01)
*H01L 33/46* (2010.01)
(Continued)

(52) U.S. Cl.
CPC .............. *H01L 33/46* (2013.01); *H01L 33/06* (2013.01); *H01L 33/32* (2013.01); *H01L 33/382* (2013.01);
(Continued)

(58) Field of Classification Search
CPC ........ H01L 33/60; H01L 33/382; H01L 33/42
See application file for complete search history.

(56) References Cited

U.S. PATENT DOCUMENTS

| 7,964,881 B2 | 6/2011 | Choi et al. |
| 8,008,683 B2 | 8/2011 | Choi et al. |

(Continued)

FOREIGN PATENT DOCUMENTS

| CN | 101675539 A | 3/2010 |
| CN | 101681958 A | 3/2010 |

(Continued)

*Primary Examiner* — Michael Shingleton
(74) *Attorney, Agent, or Firm* — Slater Matsil, LLP

(57) ABSTRACT

An optoelectronic semiconductor chip is disclosed. In an embodiment the optoelectronic semiconductor chip includes a semiconductor body of semiconductor material, a p-contact layer and an n-contact layer. The semiconductor body includes an active layer intended for generating radiation. The semiconductor body includes a p-side and an n-side, between which the active layer is arranged. The p-contact layer is intended for electrical contacting the p-side. The n-contact layer is intended for electrical contacting the n-side 1b. The n-contact layer contains a TCO layer and a mirror layer, the TCO-layer being arranged between the n-side of the semiconductor body and the mirror layer.

19 Claims, 1 Drawing Sheet

(51) Int. Cl.
*H01L 33/38* (2010.01)
*H01L 33/42* (2010.01)
*H01L 33/60* (2010.01)
*H01L 33/06* (2010.01)
*H01L 33/32* (2010.01)
*H01L 33/40* (2010.01)
*H01L 33/20* (2010.01)

(52) U.S. Cl.
CPC .............. *H01L 33/42* (2013.01); *H01L 33/60* (2013.01); *H01L 33/20* (2013.01); *H01L 33/405* (2013.01); *H01L 2924/0002* (2013.01)

(56) References Cited

U.S. PATENT DOCUMENTS

| | | | |
|---|---|---|---|
| 8,188,495 B2 | 5/2012 | Muraki et al. | |
| 8,241,893 B2 * | 8/2012 | Ugolin | G01N 33/5438 422/68.1 |
| 8,526,476 B2 | 9/2013 | Engl et al. | |
| 9,054,016 B2 | 6/2015 | Moosburger et al. | |
| 2007/0105260 A1 | 5/2007 | Fudeta | |
| 2008/0237622 A1 | 10/2008 | Choi et al. | |
| 2008/0315228 A1 | 12/2008 | Krames et al. | |
| 2009/0039766 A1 | 2/2009 | Meijer et al. | |
| 2009/0283787 A1 * | 11/2009 | Donofrio | H01L 33/405 257/98 |
| 2010/0171135 A1 | 7/2010 | Engl et al. | |
| 2010/0208763 A1 | 8/2010 | Engl et al. | |
| 2011/0049555 A1 | 3/2011 | Engl et al. | |
| 2011/0198640 A1 * | 8/2011 | Ahlstedt | H01L 33/405 257/98 |
| 2012/0086026 A1 | 4/2012 | Engl et al. | |
| 2013/0221392 A1 | 8/2013 | Engl et al. | |

FOREIGN PATENT DOCUMENTS

| | | |
|---|---|---|
| CN | 101960623 A | 1/2011 |
| DE | 102007022947 A1 | 10/2008 |
| DE | 102007029370 A1 | 11/2008 |
| DE | 102008011848 A1 | 9/2009 |
| JP | 2007335529 A | 12/2007 |
| JP | 2008192710 A | 8/2008 |
| JP | 2009094107 A | 4/2009 |
| JP | 2009105376 A | 5/2009 |
| JP | 2010087283 A | 4/2010 |
| JP | 2010098334 A | 4/2010 |
| JP | 2010103469 A | 5/2010 |
| JP | 2012510173 A | 4/2012 |
| TW | 200903863 A | 1/2009 |
| TW | 1315917 B | 10/2009 |
| TW | 200945635 A1 | 11/2009 |

* cited by examiner

OPTOELECTRONIC SEMICONDUCTOR CHIP

CROSS-REFERENCE TO RELATED APPLICATIONS

This patent application is a continuation of U.S. application Ser. No. 14/122,134, filed Mar. 8, 2014, which is a national phase filing under section 371 of PCT/DE2012/100118, filed Apr. 26, 2012, which claims the priority of German patent application 10 2011 102 376.7, filed May 25, 2011, and German patent application 10 2011 109 942.9, filed Aug. 10, 2011, all of which are incorporated herein by reference in their entirety

TECHNICAL FIELD

The application relates to an optoelectronic semiconductor chip comprising a semiconductor body, a p-contact layer and an n-contact layer.

BACKGROUND

An n-contact layer, used for a GaN-based semiconductor body, for example, conventionally comprises a titanium layer and a silver layer applied thereto. Such n-contact layers allow good electrical and optical properties to be achieved. However, with such n-contact layers, very thin titanium layers with thicknesses of less than 0.5 nm are needed for good optical properties. These are very difficult to produce and are subject to a number of processing variations.

In addition, although titanium exhibits good electrical contact relative to n-GaN, titanium has comparatively poor reflectivity, such that light emitted by the semiconductor body is disadvantageously absorbed by the titanium layer of the n-contact layer. In contrast, silver is a good reflector for radiation in the visible spectral range, but disadvantageously exhibits unfavorably high contact resistance to n-doped GaN. In addition, titanium and the combination of titanium and silver exhibit different physical properties, which may be disadvantageous for semiconductor chips. For example, titanium is highly reactive and is capable of oxidizing easily, which may lead to a poorly conductive electrical barrier due to the increase in contact resistance.

SUMMARY

Embodiments of the present application provide an optoelectronic semiconductor chip which avoids the above-stated disadvantages, whereby a semiconductor chip is advantageously produced which has an n-contact layer which exhibits improved electrical and at the same time optical properties.

In one embodiment the optoelectronic semiconductor chip comprises a semiconductor body of semiconductor material, a p-contact layer and an n-contact layer. The semiconductor body comprises an active layer intended for generating radiation. The semiconductor body further comprises a p-side and an n-side, between which the active layer is arranged. The p-contact layer is intended for electrical contacting of the p-side of the semiconductor body. The n-contact layer is intended for electrical contacting of the n-side of the semiconductor body. The n-contact layer comprises a TCO (transparent conductive oxide) layer and a mirror layer, the TCO layer being arranged between the n-side of the semiconductor body and the mirror layer.

Transparent conductive oxides are transparent, conductive materials, as a rule metal oxides, such as, for example, zinc oxide, tin oxide, cadmium oxide, titanium oxide, indium oxide, indium tin oxide (ITO), aluminum zinc oxide (AZO), aluminum indium zinc oxide (ATO), indium zinc oxide (IZO), gallium zinc oxide (GZO) or gallium tin oxide (GTO). In addition to binary metal-oxygen compounds, such as, for example, ZnO, $SnO_2$ or $In_2O_3$, the group of TCOs also includes ternary metal-oxygen compounds, such as, for example, $Zr_2SnO_4$, $CdSnO_3$, $ZnSnO_3$, $MgIn_2O_4$, $GaInO_3$, $Zr_2In_2O_5$ or $In_4Sn_3O_{12}$ or mixtures of different transparent conductive oxides. Furthermore, TCOs do not necessarily correspond to a stoichiometric composition and may also be p- or n-doped.

N-side should be understood in particular to mean an n-doped side of the layers of the semiconductor body. Likewise, a p-side should be understood to mean a p-doped side of the layers of the semiconductor body.

In the present semiconductor chip the conventionally used titanium layer is replaced by a layer of a transparent conductive oxide. The TCO layer may in this case exhibit a significantly greater thickness than the titanium layer used hitherto. Such TCO layers are significantly easier to control compared with conventionally used titanium layers, adhere well and make a good electrical contact to the semiconductor body of semiconductor material. In addition, such TCO layers are distinctly less reactive and thus less susceptible to oxidation.

By means of an n-contact layer comprising a TCO layer, in particular in conjunction with the highly reflective mirror layer of the contact layer, such as a silver layer, arranged on the side of the TCO layer remote (e.g., facing away) from the n-side of the semiconductor body, a highly reflective ohmic contact between the n-contact layer and the semiconductor body may be produced. Such n-contact layers are easy to reproduce, easy to control during production, exhibit a lower contact resistance, are not very reactive and enable a high yield due to stable contact resistance. Due to the transparency of the TCO layer for radiation in the visible spectral range, radiation emitted by the semiconductor chip is advantageously not absorbed by the re-contact layer, so enabling improved radiation efficiency.

The mirror layer is conveniently configured, with regard to material, such that it exhibits a high reflectivity for radiation emitted in the active layer during operation of the semiconductor chip or to be detected by the active layer, in particular a reflectivity of at least 60%, preferably a reflectivity of at least 80%. In particular, a metallic mirror layer is especially suitable.

In one preferred embodiment, the mirror layer contains silver. The mirror layer may, in particular, consist of silver or a silver-containing alloy. Silver exhibits high reflectivity in the visible and ultraviolet spectral range. Another material may be used instead, for example, aluminum, rhodium, palladium, nickel or chromium. Gold is suitable for the infrared spectral range, for example.

The semiconductor chip is preferably an optoelectronic semiconductor chip, which allows the conversion of electrical power into, for example, constant or pulsed light emission, for instance, for data communication or vice versa.

The optoelectronic semiconductor chip is for example a radiation-emitting semiconductor chip. The semiconductor chip is preferably an LED, particularly preferably a thin film LED. For the purposes of the application, an LED is regarded as a thin film LED if, during production thereof, the growth substrate on which the semiconductor body was grown epitaxially has preferably been completely detached.

The active layer of the semiconductor body preferably contains a pn-junction, a double heterostructure, a single quantum well (SQW) or a multi quantum well structure (MQW) for radiation generation. The term quantum well structure does not here have any meaning with regard to the dimensionality of the quantization. It encompasses, inter alia, quantum troughs, quantum wires and quantum dots and any combination of these structures.

The semiconductor body, in particular the active layer, preferably contains a III/V semiconductor material. III/V-semiconductor materials are particularly suitable for generating radiation in the ultraviolet, through the visible to the infrared spectral range. The semiconductor body comprises a plurality of semiconductor layers deposited epitaxially on one another, in which the active layer is arranged. The layers of the semiconductor body are, for example, grown on a growth substrate. In this case, the active layer separates the p-doped side of the semiconductor body from the n-doped side of the semiconductor body.

In a further development, the p-contact layer and the n-contact layer are arranged on the same side of the semiconductor body. For example, the p-contact layer and the n-contact layer are arranged on the p-side of the semiconductor body. The opposite side of the semiconductor chip from the contact layers serves in this case preferably as a radiation exit side for the radiation generated in the semiconductor chip. A large proportion of the radiation generated by the active layer is coupled out of the semiconductor chip on the radiation exit side.

The semiconductor chip thus preferably exhibits one-sided contacting, such that the radiation exit side is free of contact structures and contact layers. In this way, absorption processes are advantageously prevented on the radiation exit side of the semiconductor chip, such that shading effects and efficiency losses may advantageously be minimized.

In one further development the p-contact layer directly adjoins the p-side of the semiconductor body, the n-contact layer being arranged on the side of the p-contact layer remote (e.g., facing away) from the semiconductor body. An electrically insulating layer is arranged between the p-contact layer and the n-contact layer. The n-contact layer and the p-contact layer are thus insulated electrically from one another, so preventing short-circuiting between the contact layers.

In the present case the arrangement is thus as follows: n-contact layer, electrically insulating layer, p-contact layer and semiconductor body. In this case, the layers are arranged vertically one above the other.

The electrically insulating layer is, for example, a passivation layer, which spatially and electrically separates the p-contact layer and the n-contact layer completely from one another. The p-contact layer and the n-contact layer are thus not in direct contact at any point.

In a further development the n-contact layer is passed through the p-contact layer and through the p-side of the semiconductor body to the n-side by means of a hole. The p-contact layer and the p-side accordingly comprise a hole, into which the n-contact layer extends. The hole in this case passes through the active layer, such that the n-contact layer extends to the n-side of the semiconductor body. The hole thus also passes through the p-side and the active layer to the n-side, the hole additionally projecting into the n-side and preferably ending there.

At the side regions the hole comprises the electrically insulating layer, which electrically insulates the n-contact layer from the p-contact layer and the p-side of the semiconductor body.

The p-contact layer is accordingly arranged directly on the p-side of the semiconductor body and provided for direct electrical contacting of the p-side. The n-contact layer is arranged spaced from the semiconductor body. The spacing is brought about by the p-contact layer and the electrically insulating layer. The n-side of the semiconductor body may be electrically contacted by means of the n-contact layer through the hole.

The semiconductor chip may also comprise a plurality of holes, through each of which the n-contact layer passes. In this case, the holes are spaced from one another. The holes are arranged such that the n-side of the semiconductor body is provided maximally uniformly with current, so ensuring that radiation is generated uniformly in the active layer.

In a further development, the n-contact layer contains a silver layer, the TCO layer of the n-contact layer being arranged between the n-side of the semiconductor body and the silver layer of the n-contact layer. The n-contact layer is accordingly composed of two layers, the silver layer and the TCO layer. The silver layer here forms the mirror layer, which is a good reflector for radiation in the visible spectral range. The high contact resistance of the silver layer relative to the semiconductor material of the semiconductor body may be improved by means of the TCO layer, so achieving highly reflective ohmic contact of the n-contact layer.

For example, the mirror layer is arranged on the side of the electrically insulating layer remote from the semiconductor body and in the holes. In this case, the TCO layer separates the mirror layer, in particular the silver layer, from the semiconductor body, i.e., is arranged between mirror layer, in particular silver layer, and semiconductor body. In particular, the TCO layer directly adjoins the semiconductor material and the mirror layer, in particular the silver layer.

In a further development, the mirror layer, in particular the silver layer, passes through the hole and the TCO layer is arranged on the hole. Accordingly, no direct contact is brought about between mirror layer, in particular silver layer, and semiconductor material, since the TCO layer is arranged therebetween. In this case, the TCO layer closes off the hole.

In one further development, the TCO layer contains ZnO (zinc oxide) or SnO (tin oxide). The TCO layer may additionally be combined with a further metal or a mixture of further metals, for instance, aluminum, gallium and/or indium. Aluminum zinc oxide, aluminum tin oxide, gallium tin oxide, gallium zinc oxide, indium tin oxide or indium zinc oxide may, for example, be used. These materials are distinguished by low absorption in the visible spectral range and accordingly by high transparency for radiation in the visible spectral range. In addition, these materials exhibit low contact resistance to the semiconductor material, such that good ohmic contact is brought about.

In a further development, the TCO layer exhibits a thickness of greater than 0.5 nm. Preferably, the TCO layer exhibits a thickness in a range of between 15 nm and 25 nm inclusive. Contact layers in such a thickness range are advantageously subject to only slight processing variations during production. In addition, layers of such thicknesses are readily reproducible due to controllable production.

In a further development the semiconductor body comprises oblique side faces. The semiconductor body is arranged on a carrier, for example, the lateral extent of the semiconductor body tapering with distance from the carrier.

The angle between the lateral extent of the carrier and the oblique side faces amounts to 45°, for example.

By means of the oblique side faces total reflection effects at the side faces of the radiation emitted by the active layer may be reduced, such that the outcoupling efficiency of the semiconductor chip is advantageously increased.

In a further development the semiconductor body is based on GaN. N-doped GaN exhibits good electrical contact to TCO, wherein a highly reflective ohmic contact may be made between the n-contact layer consisting of the combination of TCO and silver and the semiconductor body of GaN.

BRIEF DESCRIPTION OF THE DRAWINGS

Further advantages and advantageous embodiments are revealed by the exemplary embodiments described below in conjunction with FIGS. 1 to 3, in which.

Figure 1:
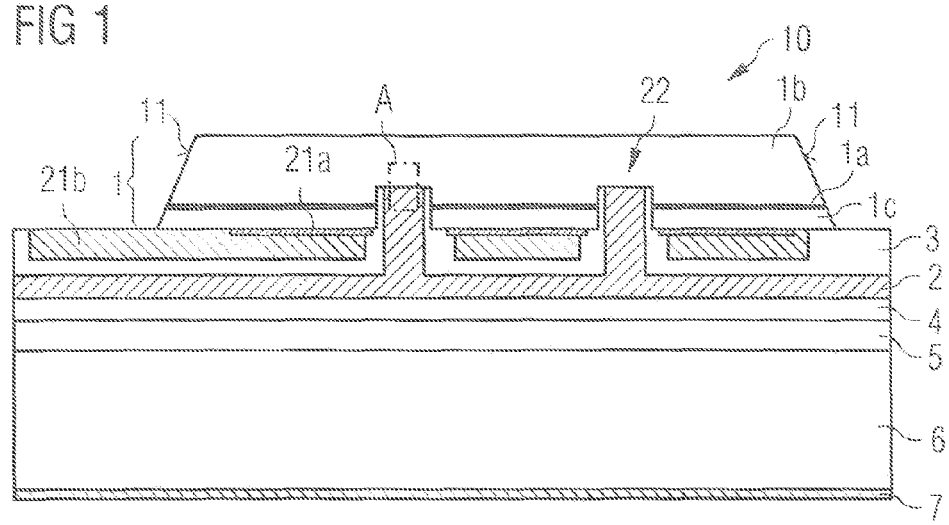
FIG. 1 shows a schematic cross-section of an exemplary embodiment of a semiconductor chip.

In the figures, identical or identically acting components may in each case be provided with the same reference numerals. The components illustrated and their size ratios to one another should not be viewed as being to scale. Rather, individual elements such as, for example, layers, patterns, components and regions are shown exaggeratedly thick or large for greater ease of depiction and/or better comprehension.

DETAILED DESCRIPTION OF ILLUSTRATIVE EMBODIMENTS

Figure 3:
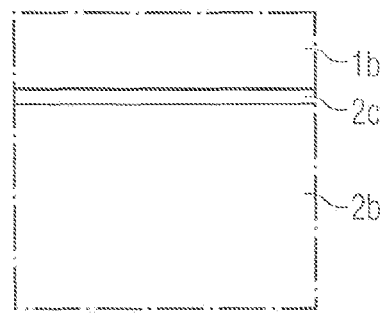
FIG. 3 is a schematic representation of a portion of the n-contact layer according to the prior art.

FIG. 3 shows a cross-section of a portion of a semiconductor chip according to the prior art. The portion in particular shows n-contacting of the semiconductor chip. The semiconductor chip comprises an n-side 1b, which is formed of semiconductor layers. An re-contact layer 2b, 2c is used in order to contact the n-side of the semiconductor chip. The n-contact layer is composed of a silver layer 2b and a titanium layer 2c, the titanium layer 2c being arranged between n-side 1b of the semiconductor chip and silver layer 2b.

The silver layer 2b is accordingly not in direct contact with the n-side of the semiconductor chip. The titanium layer 2c makes a good electrical contact to the n-side 1b of the semiconductor chip. However, such titanium layers 2c exhibit poor reflectivity of the radiation in the visible spectral range, such that the radiation is absorbed at least partially by the titanium layer, which disadvantageously results in loss of radiation efficiency. In addition, the titanium layer 2c is disadvantageously highly reactive and readily oxidizable.

The silver layer 2b is a good reflector for radiation in the visible spectral range, but exhibits unfavorably high contact resistance to the n-side 1b of the semiconductor chip.

The titanium layer 2c is conventionally made very thin due to its absorbent properties. For example, such a titanium layer 2c exhibits a thickness of at most 0.5 nm.

Such conventionally used n-contact layers comprising a titanium layer 2c and a silver layer 2b accordingly exhibit a number of disadvantages, such as, for example, absorption effects, disadvantageous susceptibility to oxidation and unfavorable contact resistances.

To produce an n-contact layer which avoids these disadvantages, the conventionally used titanium layer is replaced by a TCO layer. The TCO layer, with a silver layer arranged therebehind, exhibits low absorption together with good reflectivity for radiation in the visible spectral range. Such TCO layers may in addition be significantly better controlled than conventional titanium layers, adhere well, produce good electrical contact and are distinctly less reactive.

FIG. 1 shows a schematic cross-section through a semiconductor chip 10 comprising a semiconductor body 1. The semiconductor body 1 comprises an n-side 1b, a p-side is and an active layer 1a, which is arranged between n-side 1b and p-side 1c. The semiconductor body is preferably based on GaN. The semiconductor body 1 is, for example, a radiation-emitting semiconductor chip, preferably an LED, particularly preferably a thin-film LED.

The semiconductor body 1 comprises oblique side faces 11. Oblique side faces are, in particular, understood to be side faces constructed at an angle of between 0 and 90° to the lateral extent of the layers of the semiconductor body. The angle is preferably between 45° and 90°. The oblique side faces 11 may advantageously improve outcoupling efficiency for the radiation emitted by the active layer, since total reflection effects are reduced.

The semiconductor body 1 comprises a p-contact layer 21a for p-contacting and an n-contact layer 2 for n-contacting. The p-contact layer 21a is intended for electrical contacting of the p-side 1c of the semiconductor body 1. The n-contact layer 2 is intended for electrical contacting of the n-side 1b of the semiconductor body 1.

In the present exemplary embodiment, the p-contact layer 21a and the n-contact layer 2 are arranged on the same side of the semiconductor body 1. In particular, the contact layers 21a, 2 are arranged on the p-side 1c of the semiconductor body 1. The p-contact layer 21a in this case directly adjoins the p-side is of the semiconductor body 1. A current spreading layer 21b may be arranged on the side of the p-contact layer 21a remote from the semiconductor body 1, which current spreading layer allows uniform current carrying and current spreading on the p-side is of the semiconductor body 1.

An electrically insulating layer 3 is arranged on the side of the p-contact layer 21a and the current spreading layer 21b remote from the semiconductor body 1. The electrically insulating layer is for example a passivation layer. The n-contact layer 2 is arranged on the side of the electrically insulating layer 3 remote from the p-contact layer 21a. The electrically insulating layer 3 here separates the p-contact layer 21a completely from the n-contact layer 2. The electrically insulating layer 3 is thus arranged between p-contact layer 21a and n-contact layer 2.

The n-contact layer 2 passes to the n-side 1b of the semiconductor chip by means of a hole 22 through the p-contact layer 21a and through the p-side 1c of the semiconductor body 1. The hole 22 here extends through the p-contact layer 21a, the p-side 1c and the active layer 1a and ends in the n-side 1b of the semiconductor body 1. The n-contact layer 21a, the p-side 1c and the active layer 1a are pierced right through by the hole 22.

The semiconductor chip 10 may also comprise a plurality of holes 22, which are arranged in the n-side 1b of the semiconductor body 1 in accordance with the desired current input.

The n-contact layer 2 contains a mirror layer in the form of a silver layer and a TCO layer. The silver layer is arranged on the side of the electrically insulating layer 3 remote from the p-contact layer 21a and in the hole 22 or holes. The TCO layer of the n-contact layer 2 is arranged between the silver layer and the semiconductor material of the n-side 1b of the semiconductor body 1. In particular, the TCO layer is arranged on the hole 22.

The TCO layer is not shown in FIG. 1 for clarity's sake. The n-contact of the n-contact layer 2 to the n-side 1b of the semiconductor body 1, however, is shown and explained in greater detail in FIG. 2.

For the purposes of electrical insulation, the hole 22 or the holes are lined with the electrically insulating layer 3, such that the n-contact layer 2 and the p-contact layer 21a and the p-side 1c are not in direct contact with one another nor make electrical contact to one another at any point.

Electrical contacting of the semiconductor chip 1 thus proceeds on a one-sided basis on the p-side of the semiconductor body 1. On the opposite side of the semiconductor body 1 from the p-side 1c, a radiation exit side is formed, through which the radiation emitted by the active layer is for the most part coupled out of the semiconductor chip 10. On the side of the re-contact layer 2 remote from the semiconductor body 1 there is arranged a barrier layer 4, which prevents ion diffusion between individual layers of the semiconductor chip 10.

On the side of the barrier layer 4 remote from the n-contact layer 2 there is arranged a solder layer 5, by means of which the semiconductor chip 10 is applied and fastened to a carrier 6. On its side remote from the semiconductor body 1, the carrier 6 comprises an electrical connection layer 7, through which electrical connection to the n-contact layer 2 may be brought about.

Figure 2:
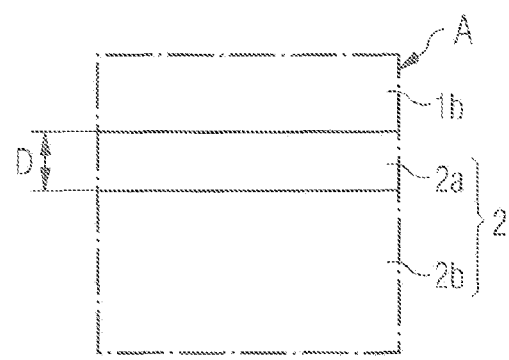
FIG. 2 is a schematic representation of a portion of the semiconductor chip according to the exemplary embodiment of FIG. 1.

The portion A indicated in the exemplary embodiment of FIG. 1 is shown on an enlarged scale in FIG. 2. FIG. 2 shows in particular the electrical connection between n-side 1b of the semiconductor body 1 and n-contact layer 2. The portion is located in the region of a hole 22.

N-contact between the n-side 1b of the semiconductor body 1 and the n-contact layer 2 is brought about via the TCO layer 2a. The n-contact layer 2 is thus composed of the silver layer 2b and the TCO layer 2a, wherein the silver layer 2b is not in direct contact with the semiconductor material. The TCO layer 2a is arranged between the silver layer 2b and the semiconductor material of the n-side 1b.

The TCO layer 2a comprises ZnO or ITO, for example. Alternatively, or in addition, tin oxide, aluminum zinc oxide, aluminum tin oxide, gallium tin oxide, gallium zinc oxide or indium zinc oxide may be used, for example. The thickness D of the TCO layer 2a is in this case greater than 0.5 nm. The thickness D of the TCO layer 2a is preferably in a range between 15 nm and 25 nm inclusive, for example, 20 nm.

The thin titanium layer which is conventionally used, with a thickness of at most 0.5 nm, is thus replaced by a significantly thicker layer of a transparent conductive oxide, which, together with the silver layer arranged therebehind, allows improved reflectivity and improved ohmic contact. Such thick TCO layers may be significantly better controlled than the thin titanium layers used conventionally. In addition, the TCO layers advantageously adhere well, make good electrical contact and are distinctly less reactive than the conventional titanium layer.

By means of the n-contact layer constructed as described and consisting of a silver layer and a TCO layer, highly reflective ohmic contact may advantageously be ensured on the n-side of the semiconductor chip.

Unlike in the exemplary embodiment described, a mirror layer of a different material composition may also be used instead of the silver layer 3b. The preferably metallic mirror layer may, in particular, contain one of the materials mentioned in the general part in connection with the mirror layer or consist of such a material.

Furthermore the above-described n-contact layer is also suitable for contacting an n-side of a semiconductor chip of a different geometry. For example, the semiconductor chip may take the form of a semiconductor chip in which the p-contact layer and the n-contact layer are arranged on opposing sides of the active layer. Such a semiconductor chip may in particular take the form of a thin film semiconductor chip or of a semiconductor chip with growth substrate.

What is claimed is:

1. An optoelectronic semiconductor chip comprising:
    a semiconductor body of semiconductor material comprising a p-side, an n-side and an active layer between the p-side and the n-side, the active layer configured to generate radiation during operation;
    a p-contact layer electrically contacting the p-side of the semiconductor body; and
    an n-contact layer electrical contacting the n-side of the semiconductor body,
    wherein the n-contact layer contains a transparent conductive oxide (TCO) layer and a mirror layer, the TCO layer being arranged between the n-side of the semiconductor body and the mirror layer,
    wherein the n-contact layer passes through the p-side of the semiconductor body via a hole,
    wherein the hole projects into the n-side of the semiconductor body, and
    wherein the TCO layer is arranged in the hole between the n-side of the semiconductor body and the mirror layer.

2. The optoelectronic semiconductor chip according to claim 1, wherein the mirror layer contains silver.

3. The optoelectronic semiconductor chip according to claim 1, wherein the p-contact layer and the n-contact layer are arranged on the same side of the semiconductor body.

4. The optoelectronic semiconductor chip according to claim 3,
    wherein the p-contact layer directly adjoins the p-side of the semiconductor body,
    wherein the n-contact layer is arranged on a side of the p-contact layer remote from the semiconductor body, and
    wherein the chip further comprises an electrically insulating layer arranged between the p-contact layer and the n-contact layer.

5. The optoelectronic semiconductor chip according to claim 3, wherein the n-contact layer passes to the n-side through the p-contact layer.

6. The optoelectronic semiconductor chip according to claim 1, wherein the hole is lined with an electrically insulating layer, the electrically insulating layer directly adjoining the TCO layer and the mirror layer.

7. The optoelectronic semiconductor chip according to claim 1, wherein the TCO layer comprises zinc oxide.

8. The optoelectronic semiconductor chip according to claim 1, wherein the TCO layer comprises indium tin oxide.

9. The optoelectronic semiconductor chip according to claim 1, wherein the TCO layer comprises a material selected from the group consisting of tin oxide, aluminum zinc oxide, aluminum tin oxide, gallium tin oxide, gallium zinc oxide and indium zinc oxide.

10. The optoelectronic semiconductor chip according to claim 1, wherein the TCO layer has a thickness of greater than 0.5 nm.

11. The optoelectronic semiconductor chip according to claim 1, wherein the TCO layer has a thickness in a range between 15 nm and 25 nm, inclusive.

12. The optoelectronic semiconductor chip according to claim 1, wherein the semiconductor body comprises oblique side faces.

13. The optoelectronic semiconductor chip according to claim 1, wherein the semiconductor body comprises GaN.

14. The optoelectronic semiconductor chip according to claim 1,
wherein the n-contact layer passes through the p-side by means of a plurality of holes and ends in the n-side of the semiconductor body, and
wherein the TCO layer is arranged in the plurality of holes between the n-side of the semiconductor body and the mirror layer.

15. An optoelectronic semiconductor chip comprising:
a semiconductor body of semiconductor material;
a p-contact layer; and
an n-contact layer,
wherein the semiconductor body comprises an active layer for generating radiation during operation,
wherein the semiconductor body comprises a p-side and an n-side, the active layer being arranged between the p-side and the n-side,
wherein the p-contact layer electrically contacts the p-side of the semiconductor body,
wherein the n-contact layer electrically contacts the n-side of the semiconductor body,
wherein the n-contact layer contains a TCO layer and a mirror layer, wherein the TCO layer is arranged between the n-side of the semiconductor body and the mirror layer, and
wherein the mirror layer contains silver.

16. The optoelectronic semiconductor chip according to claim 15, wherein the n-contact passes through the p-side by means of a plurality of holes, each of the holes ending in the n-side of the semiconductor body, and wherein the TCO layer is arranged in the plurality of holes between the n-side of the semiconductor body and the mirror layer.

17. The optoelectronic semiconductor chip according to claim 15, wherein the TCO layer comprises zinc oxide or indium tin oxide.

18. The optoelectronic semiconductor chip according to claim 15, wherein the TCO layer has a thickness in a range between 15 nm and 25 nm, inclusive.

19. The optoelectronic semiconductor chip according to claim 15, wherein there is no direct contact between the mirror layer and the semiconductor body.

* * * * *